(12) United States Patent
Weaver et al.

(10) Patent No.: US 10,030,305 B2
(45) Date of Patent: Jul. 24, 2018

(54) METHOD TO PROTECT FEATURES DURING REPAIR CYCLE

(71) Applicant: GENERAL ELECTRIC COMPANY, Schenectady, NY (US)

(72) Inventors: Jared Hogg Weaver, Clifton Park, NY (US); Gregory Scot Corman, Ballston Lake, NY (US); Anteneh Kebbede, Niskayuna, NY (US); Daniel Gene Dunn, Guilderland, NY (US); Jerome Geoffrey Magnant, Rexford, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/945,824

(22) Filed: Nov. 19, 2015

(65) Prior Publication Data
US 2017/0145560 A1    May 25, 2017

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *C23C 16/04* | (2006.01) |

(52) U.S. Cl.
CPC .................. *C23C 16/045* (2013.01)

(58) Field of Classification Search
USPC .......................................................... 216/41
See application file for complete search history.

(56) References Cited

U.S. PATENT DOCUMENTS

| | | | |
|---|---|---|---|
| 4,008,844 A | 2/1977 | Duvall et al. | |
| 6,335,105 B1 * | 1/2002 | McKee | .................. C04B 37/023 416/241 B |
| 7,805,822 B2 | 10/2010 | Hanley | |
| 7,976,940 B2 | 7/2011 | Berndt et al. | |
| 2001/0001897 A1 * | 5/2001 | Zhao | ....................... B23P 15/04 29/889 |
| 2003/0196305 A1 * | 10/2003 | Kebbede | .................. B23P 6/005 29/402.11 |
| 2004/0191488 A1 * | 9/2004 | Berndt | .................... C23C 10/04 428/195.1 |
| 2013/0302522 A1 | 11/2013 | Eminoglu et al. | |
| 2014/0272249 A1 | 9/2014 | Lee et al. | |
| 2014/0349029 A1 | 11/2014 | Burd | |

FOREIGN PATENT DOCUMENTS

CN       104446460 A   *  3/2015

OTHER PUBLICATIONS

Extended European Search Report and Opinion issued in connection with corresponding EP Application No. 16199367.0 dated Apr. 12, 2017.

* cited by examiner

*Primary Examiner* — Roberts Culbert
(74) *Attorney, Agent, or Firm* — GE Global Patent Operation; John Darling

(57) ABSTRACT

A method can include applying a mask to a CMC structure, and subjecting the structure having an applied mask to a process for repair. In one embodiment, the applying a mask to a CMC structure can include applying a mask to a feature of a CMC structure.

36 Claims, 4 Drawing Sheets

Simulated seal slot

Slot filled w/mask

METHOD TO PROTECT FEATURES DURING REPAIR CYCLE

The disclosure relates to ceramic matrix composite (CMC) structures in general and in particular to a method for protecting a feature of a CMC structure during a repair cycle.

BACKGROUND

Various methods are known for fabrication of a CMC structure. A CMC structure can be fabricated by melt infiltration (MI). Using MI, a preform can be placed in a chamber and arranged to be in contact with a source of liquid silicon. Liquid silicon can react with material of the preform. A CMC structure can also be fabricated using chemical vapor infiltration (CVI). For performance of CVI, a preform can be placed in a vapor chamber to cause a reaction between vapor of the chamber and material of the preform. A CMC structure can also be fabricated using polymer impregnation and pyrolysis (PIP). For performance of PIP, polymeric silicon carbide precursor can be used to infiltrate a fibrous preform. A CMC structure can also be fabricated using a combination of processes.

CMC structures are subject to damage during operation. For example CMC structures can come in contact with rigid objects and can become pierced or otherwise damaged.

BRIEF DESCRIPTION

A method can include applying a mask to a CMC structure, and subjecting the CMC structure having the applied mask to a process for repair of the CMC structure. In one embodiment, the applying a mask to a CMC structure can include applying a mask to a feature of a CMC structure.

DRAWINGS

DETAILED DESCRIPTION

Figure 1:
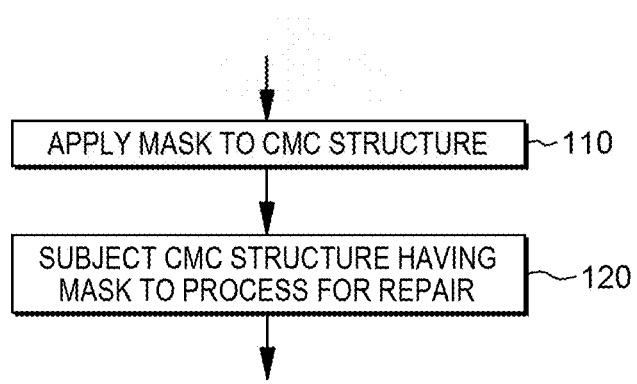
FIG. 1 is a flow diagram illustrating a method that can be performed relative to a CMC structure.

Referring to FIG. 1 a method can include at block 110 applying a mask to a CMC structure. At block 120 a method can include subjecting the CMC structure having an applied mask to a process for repair of the CMC structure. In one embodiment, the process for repair of the CMC structure can include application of heat.

Figure 2:
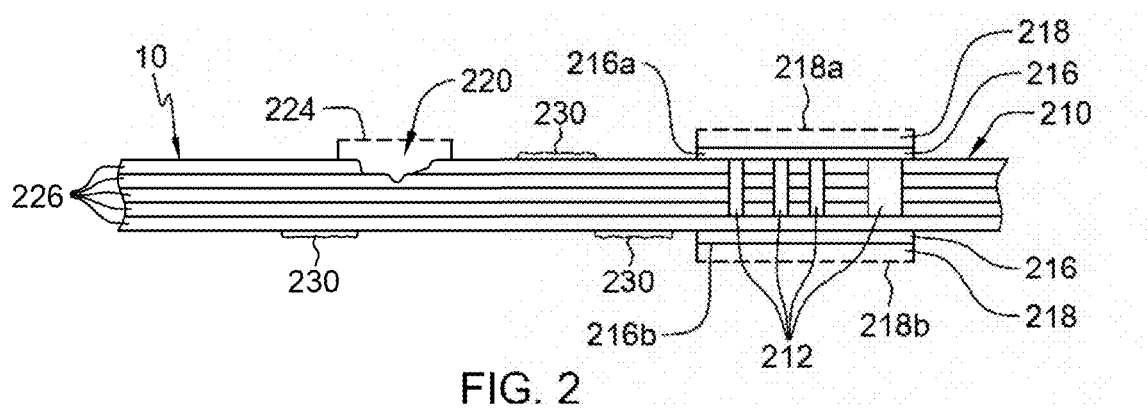
FIG. 2 is a diagram illustrating a CMC structure that can be subject to repair.

An exemplary CMC structure 10 under repair is shown in FIG. 2. CMC structure 10 in one embodiment can be a structure formed of ceramic matrix composite (CMC) material that has been formed using a CMC fabrication process. CMC structure 10 can include a plurality of features 212 for enhancing a functioning of CMC structure 10. Features 212 can include, e.g., cooling holes, attachment (mounting) holes, sealing surfaces, and slots. Feature 212 can be in one embodiment features that have been machined to critical dimensions (CDs) having small tolerances.

For performance of block 110 in one embodiment, a mask 216 can be applied to one or more feature 212 of CMC structure 10. In one embodiment, mask 216 can be applied to cover, coat, and/or fill one or more feature 212 of CMC structure 10. Mask 216 can fill feature 212 where feature 212 includes an interior. In one embodiment, mask 216 can include a plurality of mask sections. For example, referring to FIG. 2, mask 216 can include a first mask section 216a and a second mask section 216b. Where CMC structure 10 is a wall defining a hollow structure in one embodiment, mask section 216a can be an exterior mask section, and mask section 216b can be an interior mask section.

In a further aspect, structure 10 can include a damaged area 220. Damaged area 220 can be repaired when structure 10 is subject to a process for repair. A process for repair performed at block 120 can include application of heat. In one aspect, a patch 224 shown in dashed form can be applied to structure 10 as part of a preparatory process prior to performance of a process for repair at block 120. In one embodiment a method set forth herein can be absent application of a patch 224.

In a further aspect referring to FIG. 2 accumulations 230 can be formed on structure 10 as a result of performance of a process for repair.

In one embodiment, a process for repair of CMC structure 10 can be dissimilar to a process for fabrication of CMC structure 10 prior to CMC structure 10 becoming damaged.

In one embodiment, a process for repair of CMC structure 10 can include a common characteristic with a process for fabrication of CMC structure 10 prior to CMC structure 10 becoming damaged.

In one embodiment, structure 10 can be a CMC structure that has been fabricated using melt infiltration (MI) and a process for repair to which structure 10 can be subject to at block 120 can include performing MI. By employing as a process for repair of CMC structure 10 a process in common with a process used to fabricate structure 10 originally, a repair of structure 10 may be improved. Structure 10 can be repaired to exhibit structural properties that were exhibited prior to being damaged.

When a process for repair of structure 10 can include using MI, structure 10 including patch 224 (if present) can be placed in contact with a source of silicon (Si) within an MI chamber (not shown) and heat within the chamber can be activated to heat up structure 10. Temperatures during performance of MI can range from about 1380 degrees C. to about 1600 degrees C. in one embodiment and can be applied isothermally or non-isothermally.

It was determined that when MI is used as a process for repair of structure 10, accumulations 230 which can form on a surface of structure 10 resulting from performance of a process for repair at block 120 can be in the form of silicon. Silicon from a silicon source within a MI chamber and carbon of a repair area of structure 10 can react to form silicon carbide. Silicon carbide can include an essentially un-meltable crystal lattice structure. However, excess silicon that does not react to form silicon carbide can solidify to define accumulations 230 in the form of silicon. Accumulations 230 can be formed on a surface of structure 10 and can potentially compromise the functionality of structure 10. Accumulations 230 can collect at features 212 which may have been machined to critical dimensions.

It was determined that, with use of MI, excess silicon in liquid form that may be produced when MI is performed at block 120 can potentially be transmitted to make contact with feature 212, solidify and compromise the functionality of structure 10, e.g., by solidifying at features 212 to form accumulations 230 that can negatively affect operation of features 212. It was determined that if accumulations 230, e.g., formed of silicon are solidified within features 212, a subtractive process, e.g., grit blasting, machining, can potentially be used to remove the accumulations 230, but subtractive processes can potentially destroy the tolerances of such features 212. Potentially, features 212 can be re-machined, but re-machining can reduce structural strength of CMC structure 10, can cause critical dimensions to fall outside of a tolerance range, and re-machining can impose considerable costs in any event.

Accumulations 230 can be particularly difficult to remove in some embodiments given that accumulations 230 can become chemically bonded to a surface of structure 10.

Where a process for repair to which structure 10 can be subject to at block 210 can include MI, mask 216 can be adapted to inhibit liquid silicon contact with features 212. Whereas accumulations 230 on structure 10 are shown at areas away from features 212, accumulations 230 without mask 216 can be formed at features 212.

In one embodiment, structure 10 can be a CMC structure that has been fabricated using chemical vapor infiltration (CVI) and a process for repair to which structure 10 can be subject to at block 120 can include CVI. By employing in a process for repair a process used in the original fabrication of structure 10. Structure 10 can be repaired so that it can exhibit structural properties exhibited by structure 10 prior to being damaged.

According to a CVI process a structure 10 can be placed in a CVI chamber (not shown), a heat source can be activated to heat up the chamber, and a vapor source (not shown) can be activated so that vapor contacts structure 10 within the CVI chamber. Temperatures during performance of CVI can range from about 700 degrees C. to about 1400 degrees C. in one embodiment.

It was determined that when performing CVI to repair a structure 10 in accordance with FIG. 2, vapor can contact features 212 (FIG. 2) and reaction products can solidify to define accumulations 230 that can form on a surface of structure 10. Reaction products can include silicon carbide (SiC). Without mask 216 applied reaction products can adhere to surfaces of features 212 and can solidify to define accumulation 230 to inhibit functioning of features 212. Where a process for repair to which structure 10 can be subject to at block 210 can include CVI, mask 216 can be adapted to inhibit vapor contact with features 212. Whereas accumulations 230 on structure 10 are shown at areas away from features 212, accumulations 230 without mask 216 applied can be readily formed at features 212. Mask 216 in the case where CVI is used as a process for repair can provide hermetic sealing so that gasses can be restricted from contacting a feature having mask 216 applied.

For inhibiting vapor contact with features 212 during performance of a process for repair at block 120 where repair includes performance of CVI, mask 216 can be applied to features 212 as shown in FIG. 2.

In one embodiment, a process for repair as set forth herein can include polymer impregnation and pyrolysis (PIP). For performance of PIP, polymeric silicon carbide precursor can be used to infiltrate a fibrous preform. In one embodiment, structure 10 can be a CMC structure that has been fabricated using PIP and a process for repair as set forth herein can include PIP.

In one embodiment, a process for repair can include a combination of processes for repair, e.g. a combination of two or more of MI, CVI, or PIP processes as set forth herein.

On completion of block 120 (FIG. 1) additional processes can be performed. For example, on completion of block 120, unwanted material, e.g., accumulations 230, e.g., in the form of solidified silicon in the case of MI or solidified SiC in the case of CVI, may have formed on a surface of structure 10.

In one embodiment of the method 10 set forth in FIG. 1, method 10 can include removing accumulations 230 formed on structure 10. During performance of a process for repair block 120, accumulations 230 of FIG. 2 can accumulate on structure 10 and mask 216 can remain on structure 10.

A removal of accumulations 230 can include, e.g., hand scrubbing or light cleaning. In one embodiment, machining or grit blasting can be used for removal of one or more accumulations 230 or mask 216. In one embodiment, a less abrasive cleaning process can be employed for removal of mask 216 than for removal of accumulations 230. In one embodiment, a subtractive process, e.g., grit blasting or machining can be employed to remove such unwanted material. However, in the development of methods herein it was determined that subtractive processing can potentially subject features 212 to damage. Accordingly, it can be advantageous to use a less abrasive process for removal of mask 216 than is used for removal of accumulations 230. In some embodiment, it can be advantageous to employ a non-abrasive and non-contact process, e.g., a chemical etching process, or ultrasonic cleaning process, for removal of mask 216.

Figure 3:
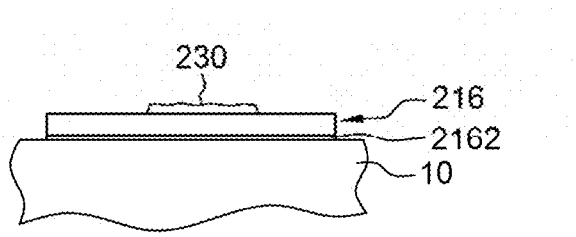
FIG. 3 is a diagram illustrating a CMC structure that can be subject to repair.

In one aspect depicted in FIG. 3, a mask 216 having one or more mask section can include a release layer 2162. Release layer 2162 can be adapted to be easily removed to thereby permit easy removal of accumulations 230 formed on mask 216. Release layer 2162 can be formed to be under mask 216 so that mask 216 can be removed with the removal of release layer 2162.

In one aspect, a supplemental mask 218 (FIG. 2) can be applied over mask 216 after performance of block 120 and prior to performance of a subtractive process to remove accumulations 230. Where mask 216 includes a release layer 2162, release layer 2162 can be removed prior to application of mask 218. Mask 218 can have multiple sections, e.g., sections 218a and 218b. Mask 218 can inhibit damage to protected areas of structure 10 during performance of a subtractive process to remove accumulations 230. Mask 218 can be formed of vinyl in one embodiment. With supplemental mask 218 applied, machining or grit blasting can be performed for removal of accumulations 230 with reduced risk of damage to features 212.

On completion of block 120 (FIG. 1), e.g., subsequent to, before or contemporaneously with removal of accumulations 230, mask 216 and/or supplemental mask 218 can be removed. A process for removal of mask 216 and/or mask 218 can include, e.g., one or more of hand scrubbing, other light cleaning, chemical etching using wet etching (e.g. using acid or base), or chemical etching using dry etching (e.g. using oxidation or other reactive atmosphere). A process for removal of a mask can be selected in some cases based on a material of the mask.

Mask 216 can be formed of a variety of different materials. The mask can be adapted to inhibit flow of liquid material to a functional feature 212 during melt infiltration. Inhibiting flow to a feature 212 can be achieved, e.g., by providing the material to be non-wetting by the liquid, by providing the material to be inert to the liquid, and/or by providing the material so that the material can react with the liquid without allowing the liquid to penetrate the mask to the functional feature 212.

In one embodiment, mask 216 can be provided to be friable. Where mask 216 is provided to be friable, mask 216 can be removed using a mechanical cleaning process.

In one embodiment, a friable mask material can include boron nitride (BN). In one example, a friable mask material can include BN with a dispersant (e.g., polyethylenimine, PEI). In another example, a friable mask material can include BN slurry with a dispersant binder (e.g., PEI). Where mask 216 is provided by a friable material, e.g., material including BN, mask 216 can be removed using a mechanical process, e.g., grit blasting, water jet, ultrasonic cleaning, mild abrasive scrubbing, or machining. BN can be milled into particle form.

In one embodiment, mask 216 can be adapted to be chemically removed. In one embodiment where mask 216 is adapted to be chemically removed, mask 216 can be removed, e.g., using wet etching. In one embodiment where mask 216 is adapted to be chemically removed, mask 216 can be removed, e.g., using an oxidation process. In one embodiment, mask 216 can be adapted for oxidative removal, and a method herein can include oxidative removal of the mask 216. In one embodiment where mask 216 is adapted to be chemically removed, mask 216 can be removed, e.g., using another reactive atmosphere to volatilize the mask, and a method herein can include reactive atmospheric removal of the mask 216.

Examples of mask materials that can be chemically removed using a wet etching process include metals, e.g., nickel, silicon, aluminum, tungsten; or oxide based material, e.g., silicon oxide, yttrium oxide, zirconium oxide. Wet etching can include using chemical etching agents, e.g., NaOH (for silicon oxide) or nitric acid (for yttrium oxide). Oxide material masks can be configured to be inert to gasses in a CVI system and can be configured to provide hermetic sealing and accordingly can be well adapted for use with a CVI process for repair. Wet etching materials used for removal of an oxide material mask, e.g., NaOH (for silicon oxide) or nitric acid (for yttrium oxide) can be inert with respect to structure 10 so that the wet etching materials does not damage structure 10 when used for removal of a oxide material mask.

Examples of mask materials that can be chemically removed using an oxidation process include materials having carbon or metals with high oxide vapor pressures. Where mask 216 is formed of a material having carbon, mask 216 can be removed by oxidation. Materials having carbon can be configured to be inert to gasses in a CVI system and can be configured to provide hermetic sealing and accordingly can be well adapted for use with a CVI process for repair. Where mask 216 is formed of material having metal, mask 216 can be removed by oxidation.

In one aspect, mask 216 can be provided to be chemically inert to inhibit chemical bonding of mask 216 to a surface of CMC structure 10. Providing mask 216 to be chemically inert to inhibit chemical bonding of mask 216 to a surface of structure 10 can adapt mask 216 so that mask 216 can be adapted for ease of removal.

In one aspect, mask 216 can be adapted to be resistant to wetting by a liquid. It was determined that providing a mask 216 so that mask 216 can be resistant to wetting can avoid a problem wherein mask 216 can become wetted via capillary action so that liquid products resulting from performance of block 120 contact features 212, e.g., holes and then solidify. Examples of material resistant to wetting include nitride materials and oxide materials. In one embodiment where the liquid is silicon, mask 216 can be formed of boron nitride (BN). In one embodiment where the liquid is silicon, mask 216 can be formed of silicon dioxide ($SiO_2$).

In one aspect mask 216 can be adapted so that during the performance of a process for repair at block 120 including the application of heat, mask 216 is one or more of melt resistant or vaporization resistant. In the development of methods herein it was determined that material of mask 216 can potentially melt or vaporize to form products that can contact features 212. To reduce a risk of mask melt or vaporization products contacting features 212, mask 216 can be formed of one or more of melt resistant or vaporization resistant material. Forming mask 216 to be one or more of melt resistant or vaporization resistant can inhibit vaporization of material of mask 216 during performance of a process for repair block 120. Examples of melt resistant materials can include nitrides, oxides, and carbons, e.g., boron nitride, silicon dioxide (silica), carbon, yttrium oxide. Examples of vaporization resistant material can include nitrides, oxides, and carbons, e.g., boron nitride, silicon dioxide (silica), carbon, yttrium oxide.

Mask 216 can be applied to structure 10 using a variety of different processes. Mask 216 can be e.g., painted on, sprayed on, deposited on, or sputtered on. In one embodiment, material forming mask 216 can be a carbon based material sputtered onto a surface of structure 10. In such embodiment, mask 216 can be removed by oxidation. Methods for applying mask 216 can include, e.g., brushing, spraying, sputtering, chemical vapor deposition, cutting into a tape and applying a tape to surface, applying a mask in a putty form to a surface.

Figure 4:
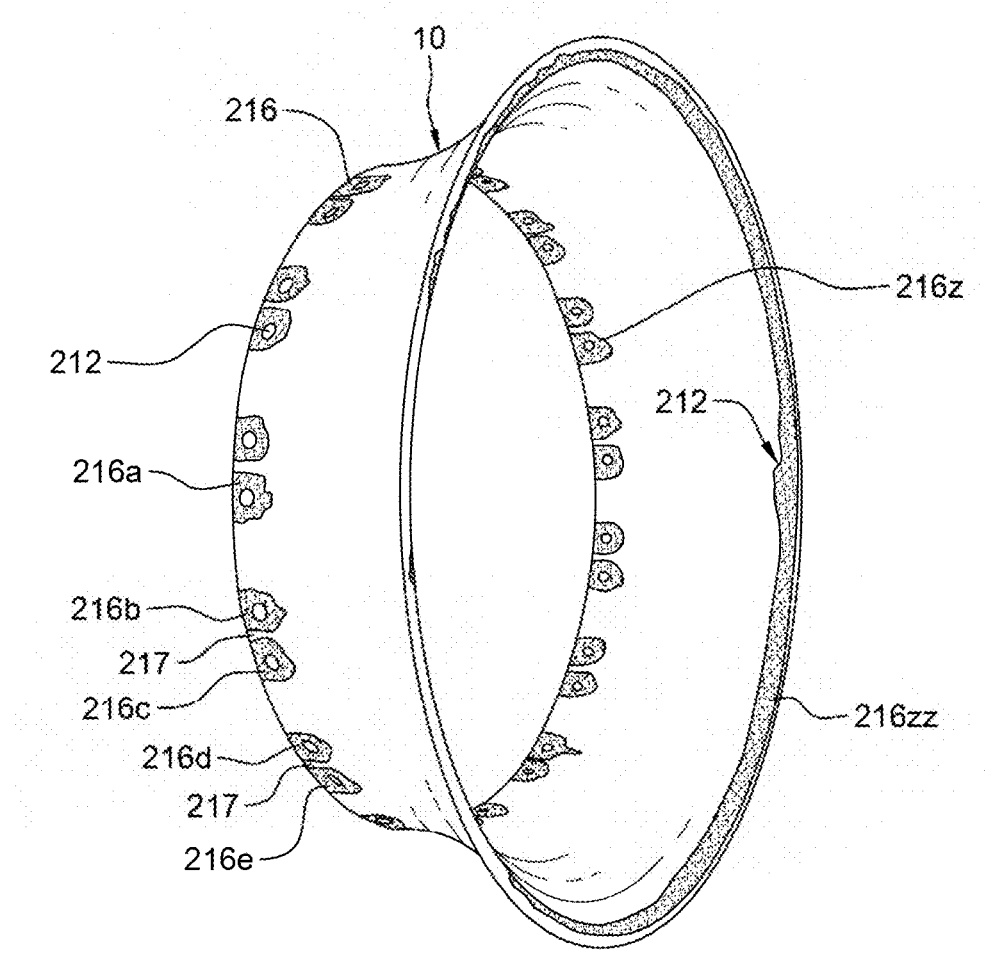
FIG. 4 is a schematic diagram of a CMC structure that can be subject to repair.

A specific example of a CMC structure 10 that can be subject to a process for repair is shown in FIG. 4. In the embodiment of FIG. 4, structure 10 can be in the form of a combustor liner. Structure 10 can be of hollow form as shown in FIG. 4 and can define an interior and an exterior. Functional features 212 of structure 10 can include one or more attachment hole as shown in FIG. 4 which can include mask sections 216a, 216b, 216c, 216d, 216e, 216z applied thereto. Functional features 212 as shown in FIG. 4 can include one or more sealing surface 212 having mask section 216zz applied thereto. Mask 216 that can be applied at block 110 (FIG. 1) in the example shown in FIG. 4 can include a plurality of exterior mask sections, e.g., mask sections 216a, 216b, 216c, 216d, 216e. Mask 216 in the example shown in FIG. 4 can include a plurality of interior mask sections, e.g., mask section 216z. Mask 216 in the example shown in FIG. 4 can include a mask section 216zz which can be applied to functional feature 212 provided by a sealing surface. Adjacent mask sections, e.g., mask sections 216b and 216c, 216d and 216e, in the example of FIG. 4 can define weep holes 217. Weep holes (gaps in the mask) 217 can be designed to encourage flow of liquefied material off of structure 10 during performance of a process for repair in accordance with block 120 (FIG. 1). While structure 10 in the example of FIG. 4 is in the form of a combustor liner, structure 10 can alternatively be provided in the form, e.g., of a shroud, a blade, a vane, a nozzle, a turbine center frame, a cowl, an exhaust mixer.

Figure 5A:
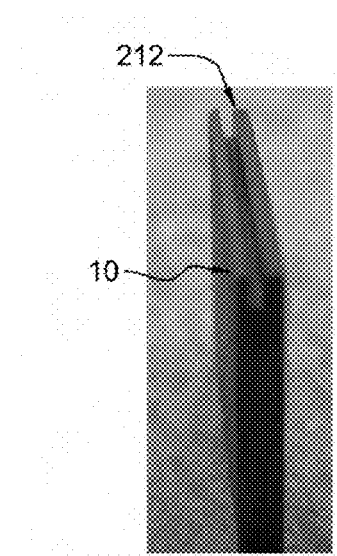
FIG. 5a is a photograph of a CMC structure having a feature.
Figure 5B:
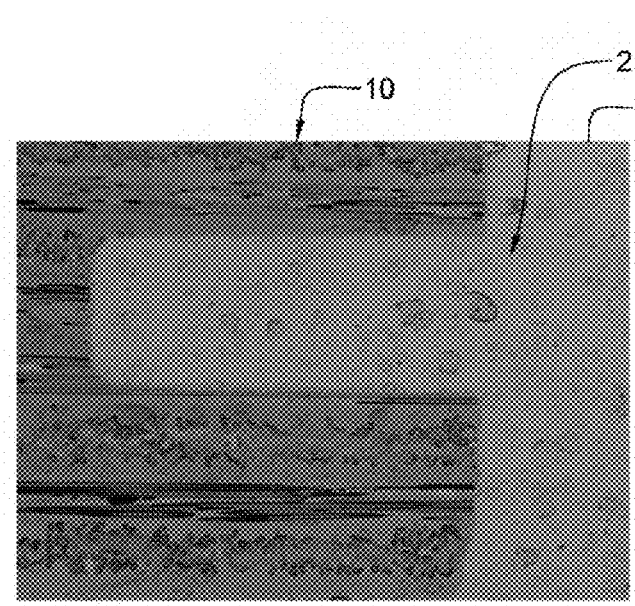
FIG. 5b is a photograph of a CMC structure having a feature after performance of a process for repair without a mask applied.

FIG. 5a shows a structure having a feature 212 provided by a seal slot. FIG. 5b shows the feature 212 after performance of MI and without application of a mask 216. Without mask 216, accumulations 230 provided by silicon can be formed at feature 212 including within any interior defined by feature 212 to negatively affect operation of feature 212. Accumulations 230 can be chemically bonded to structure 10 to make accumulations 230 particularly difficult to remove.

Figure 6A:
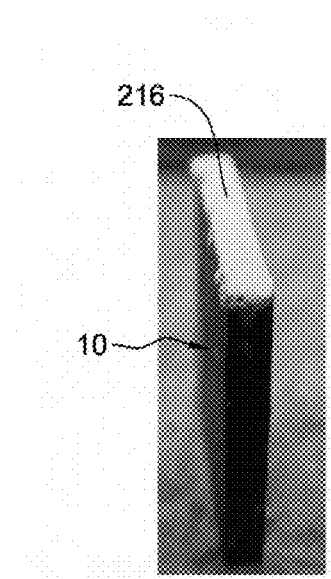
FIG. 6a is a photograph of a CMC structure having a functional feature and a mask applied to the feature.
Figure 6B:
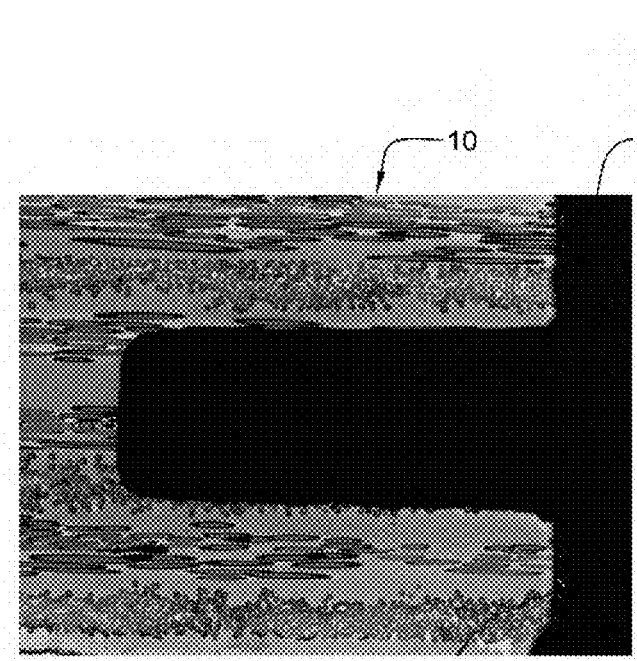
FIG. 6b is a photograph of a CMC structure having a functional feature after performance of a process for repair with mask applied.

Referring to FIG. 6a, FIG. 6a illustrates feature 212 protected by mask 216. FIG. 6b illustrates the structure of FIG. 6a after performance of MI with mask 216 applied. Mask 216 can include an area as is shown in FIG. 6b that extends to an interior that can be defined by feature 212. With mask 216 applied feature 212 (as shown in FIGS. 5 and 5b) is protected by mask 216 and therefore silicon does not form within an interior of feature 212.

Figure 7A:
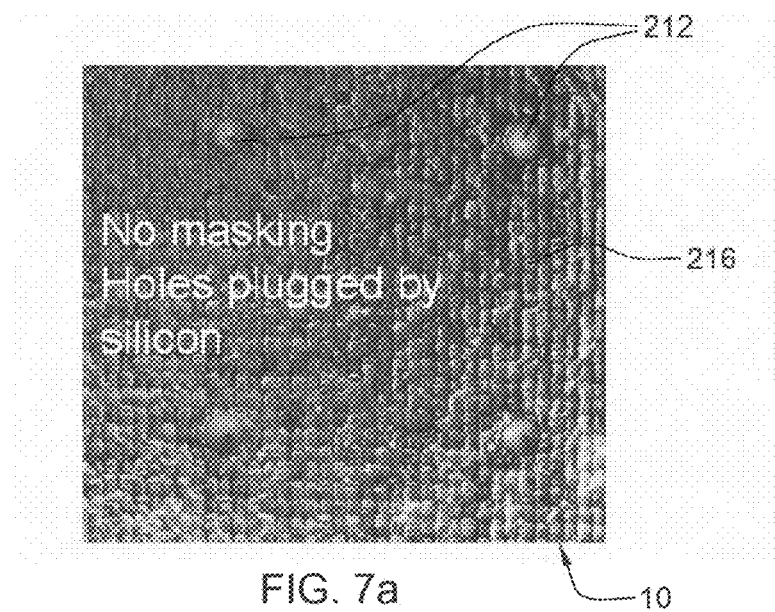
FIG. 7a is a photograph of a CMC structure without a mask applied to functional features after performance of a process for repair.
Figure 7B:
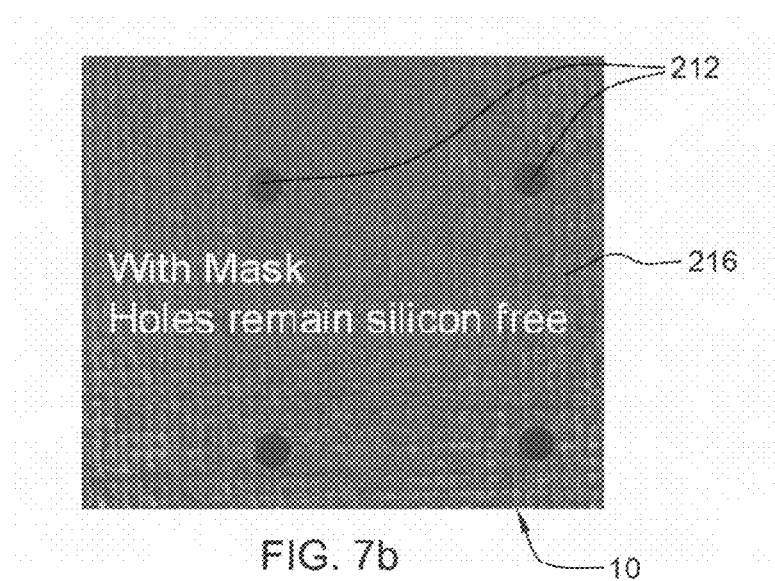
FIG. 7b is a photograph of a CMC structure having an applied mask after performance of a process for repair; and after removal of a mask that was previously applied to functional features.
Figure 7C:
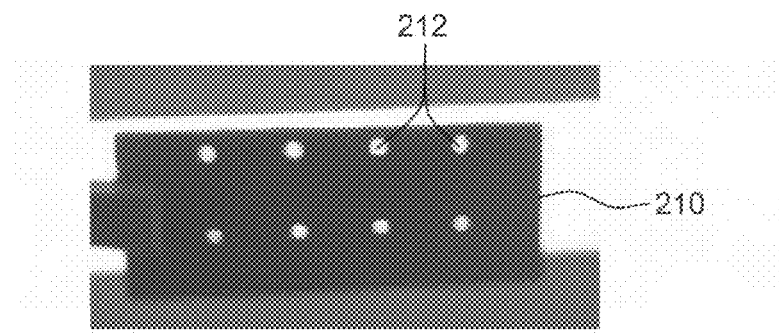
FIG. 7c is a photograph of a CMC structure after performance of a process for repair, and after removal of a mask that was previously applied to functional features.

FIG. 7a is a photograph of a CMC structure 10 without a mask 216 after performance of a process for repair. With no mask 216 applied to functional features 212, functional features 212 can be susceptible to having accumulations 230 formed thereon. FIG. 7b is a photograph of a CMC structure 10 having an applied mask 216 after performance of a process for repair and after removal of a mask 216 that was previously applied to functional features 212. With mask 216 applied, functional features 212 can be protected and can remain absent of accumulations 230 formed thereon. FIG. 7c is a photograph of a CMC structure 10 after performance of a process for repair, and after removal of a mask 216 that was previously applied to functional features 212. Protected by mask 216 during a process for repair functional features 212 can maintain their critical dimensions through a process for removing accumulations 230 and a process for removing mask 216.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method comprising:
applying a mask to a ceramic matrix composite (CMC) structure; and
subjecting the structure having the mask to a process for repair, wherein the process for repair includes melt infiltration, wherein the applying includes applying the mask to a functional feature of the structure, and wherein the mask is adapted to inhibit flow of liquid material to the functional feature during melt infiltration.

2. The method of claim 1, wherein the mask includes BN, and wherein the liquid material includes liquid silicon.

3. The method of claim 1, wherein the mask includes oxide material, and wherein the liquid material includes liquid silicon.

4. A method comprising:
applying a mask to a ceramic matrix composite (CMC) structure; and
subjecting the structure having the mask to a process for repair, wherein the process for repair includes chemical vapor infiltration (CVI).

5. The method of claim 4, wherein the mask includes vaporization resistant material.

6. The method of claim 4, wherein the applying includes applying the mask to a functional feature of the structure, and wherein the mask is adapted to inhibit flow of vapor to the functional feature during chemical vapor infiltration.

7. The method of claim 6, wherein the mask includes a metal material, and wherein the method includes, subsequent to the subjecting, removing the mask using a chemical etching process.

8. The method of claim 6, wherein the mask includes an oxide material, and wherein the method includes, subsequent to the subjecting, removing the mask using a chemical etching process.

9. The method of claim 6, wherein the mask includes an oxide material, and wherein the method includes, subsequent to the subjecting, removing the mask using a wet etching agent that is inert to the CMC structure.

10. The method of claim 6, wherein the mask includes an oxide material, and wherein the method includes removing the mask using a wet etching agent, the wet etching agent being selected from the group consisting of an acid wet etching agent and a base wet etching agent.

11. The method of claim 6, wherein the mask includes an oxide material, and wherein the method includes removing the mask using a wet etching agent that is inert to the CMC structure, wherein the oxide material is selected from the group consisting of silicon oxide, yttrium oxide, zirconium oxide, wherein the wet etching agent is selected from the group consisting of NaOH, HF, and nitric acid.

12. The method of claim 6, wherein the method includes removing the mask using a dry etching agent.

13. The method of claim 6, wherein the mask includes a carbon material, and wherein the method includes removing the mask using a dry etching process.

14. The method of claim 6, wherein the mask includes a carbon material, and wherein the method includes removing the mask using an oxidation process.

15. A method comprising:
applying a mask to a ceramic matrix composite (CMC) structure; and
subjecting the structure having the mask to a process for repair, wherein the process for repair includes a combination of two or more of the following selected from the group consisting of melt infiltration (MI), chemical vapor infiltration (CVI), and polymer impregnation and pyrolysis (PIP).

16. The method of claim 1, wherein the mask comprises a material that is resistant to wetting by a liquid in the process for repair selected from the group consisting of material including nitride and material including oxide.

17. The method of claim 16, wherein the wetting resistant material is selected from the group consisting of material including boron nitride and material including silicon dioxide.

18. The method of claim 1, wherein the mask includes material that is thermally stable under process conditions of the process for repair.

19. The method of claim 1, further comprising:
using subtractive processing to remove accumulations from the structure.

20. The method of claim 1, wherein the functional feature is selected from the group consisting of cooling holes, attachment holes, mounting holes, sealing surfaces, and slots.

21. The method of claim 1, wherein the mask is adapted to be friable, and wherein the method includes removing the mask using a mechanical process.

22. The method of claim 1, wherein the mask is adapted to be chemically etched, and wherein the method includes removing the mask using a chemical etching agent.

23. The method of claim 1, wherein the applying a mask includes applying the mask so that an area of the mask is included within an interior defined by a feature of the structure.

24. The method of claim 1, wherein the mask is adapted to be chemically inert so that the mask is resistant to chemically bonding with the structure.

25. The method of claim 1, wherein the mask includes boron nitride slurry with a polyethylenimine (PEI) dispersant.

26. The method of claim 1, wherein the mask is adapted for oxidative removal, and wherein the method includes oxidative removal of the mask.

27. The method of claim 1, wherein the process for repair includes application of heat and wherein the method includes applying the mask to a functional feature of the CMC structure.

28. The method of claim 4, further comprising:
using subtractive processing to remove accumulations from the structure.

29. The method of claim 6, wherein the functional feature is selected from the group consisting of cooling holes, attachment holes, mounting holes, sealing surfaces, and slots.

30. The method of claim 6, wherein the mask is adapted to be friable, and wherein the method includes removing the mask using a mechanical process.

31. The method of claim 6, wherein the mask is adapted to be chemically etched, and wherein the method includes removing the mask using a chemical etching agent.

32. The method of claim 6, wherein the applying a mask includes applying the mask so that an area of the mask is included within an interior defined by a feature of the structure.

33. The method of claim 6, wherein the mask is adapted to be chemically inert so that the mask is resistant to chemically bonding with the structure.

34. The method of claim 6, wherein the mask includes boron nitride slurry with a polyethylenimine (PEI) dispersant.

35. The method of claim 6, wherein the mask is adapted for oxidative removal, and wherein the method includes oxidative removal of the mask.

36. The method of claim 6, wherein the process for repair includes application of heat and wherein the method includes applying the mask to a functional feature of the CMC structure.

* * * * *